(12) United States Patent
Kato et al.

(10) Patent No.: US 9,490,127 B2
(45) Date of Patent: Nov. 8, 2016

(54) METHOD FOR MANUFACTURING SEMICONDUCTOR DEVICE

(71) Applicants: Kunihito Kato, Nisshin (JP); Shuhei Oki, Nagakute (JP); Takahiro Ito, Toyota (JP)

(72) Inventors: Kunihito Kato, Nisshin (JP); Shuhei Oki, Nagakute (JP); Takahiro Ito, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/599,916

(22) Filed: Jan. 19, 2015

(65) Prior Publication Data

US 2015/0206758 A1 Jul. 23, 2015

(30) Foreign Application Priority Data

Jan. 20, 2014 (JP) .................. 2014-007985

(51) Int. Cl.
*H01L 21/00* (2006.01)
*H01L 21/265* (2006.01)
*H01L 21/683* (2006.01)
*H01L 21/263* (2006.01)
*H01L 29/32* (2006.01)
*H01L 29/66* (2006.01)
*H01L 29/739* (2006.01)

(52) U.S. Cl.
CPC .......... *H01L 21/265* (2013.01); *H01L 21/263* (2013.01); *H01L 21/26506* (2013.01); *H01L 21/6835* (2013.01); *H01L 29/32* (2013.01); *H01L 29/66348* (2013.01); *H01L 29/7397* (2013.01); *H01L 2221/6834* (2013.01); *H01L 2221/68327* (2013.01)

(58) Field of Classification Search
CPC .............. H01L 2224/27002; H01L 21/26506; H01L 2924/13055; H01L 29/36
See application file for complete search history.

(56) References Cited

U.S. PATENT DOCUMENTS

| | | | | |
|---|---|---|---|---|
| 4,532,003 A | * | 7/1985 | Beasom | .......................... 438/358 |
| 4,868,134 A | * | 9/1989 | Kasahara | ...................... 438/379 |
| 5,004,705 A | * | 4/1991 | Blackstone | ........... H01L 21/187 |
| | | | | 148/DIG. 11 |
| 2005/0227463 A1 | * | 10/2005 | Ito | ................... H01L 21/823814 |
| | | | | 438/527 |
| 2008/0076238 A1 | | 3/2008 | Miyashita et al. | |
| 2010/0140658 A1 | | 6/2010 | Koyama et al. | |
| 2013/0260515 A1 | | 10/2013 | Mizushima | |

FOREIGN PATENT DOCUMENTS

| | | |
|---|---|---|
| JP | 2008-085050 A | 4/2008 |
| JP | 2008-172145 A | 7/2008 |
| JP | 2010-141170 A | 6/2010 |
| JP | 2013-175707 A | 9/2013 |
| JP | 2013-197306 A | 9/2013 |

* cited by examiner

*Primary Examiner* — Selim Ahmed
*Assistant Examiner* — Evan Clinton
(74) *Attorney, Agent, or Firm* — Dinsmore & Shohl LLP (57) ABSTRACT

A method includes: forming a front surface structure of a semiconductor element on a front surface side of a semiconductor substrate; forming crystal defects in the semiconductor substrate by implanting charged particles into the semiconductor substrate; subjecting the semiconductor substrate to a heat treatment after having formed the crystal defects; attaching a supporting plate on the front surface side of the semiconductor substrate after the heat treatment; thinning the semiconductor substrate by grinding a back surface side of the semiconductor substrate to which the supporting plate has been attached; and forming a back surface structure of the semiconductor element on a back surface of the thinned semiconductor substrate.

3 Claims, 5 Drawing Sheets

METHOD FOR MANUFACTURING SEMICONDUCTOR DEVICE

CROSS-REFERENCE TO RELATED APPLICATION

This application claims priority to Japanese Patent Application No. 2014-007985 filed on Jan. 20, 2014, the contents of which are hereby incorporated by reference into the present application.

TECHNICAL FIELD

A technology disclosed in the description herein relates to a method for manufacturing a semiconductor device.

DESCRIPTION OF RELATED ART

Japanese Patent Application Publication, No. 2008-172145 discloses a method for manufacturing a diode having crystal defects by implanting charged particles into a semiconductor substrate from a front surface side of the semiconductor substrate and then subjecting the semiconductor substrate to a heat treatment.

SUMMARY

The technique disclosed in Japanese Patent Application Publication, No. 2008-172145 includes implanting the charged particles into the semiconductor substrate which has been thinned into a thin substrate so as to have a same thickness as the diode, i.e. a product. The thinned semiconductor substrate breaks and/or cracks easily. Therefore, work that involves the thinned semiconductor substrate is normally carried out with a supporting plate attached to one surface of the semiconductor substrate, for supporting the semiconductor substrate.

However, an adhesive material used for the attaching of the supporting plate cannot withstand high heat. Therefore, in order to subject the semiconductor substrate to the heat treatment after having implanted the charged particles into the semiconductor substrate, it is necessary to remove the supporting plate from the semiconductor substrate. Therefore, there is a possibility that the semiconductor substrate may be damaged during the heat treatment. As a result, there is a risk of a reduction in a yield of diodes i.e., products.

The description herein discloses a method for manufacturing a semiconductor device that makes it possible to increase the yield.

The description herein discloses a method for manufacturing a semiconductor device. The method comprises: forming a front surface structure of a semiconductor element on a front surface side of a semiconductor substrate; forming crystal defects in the semiconductor substrate by implanting charged particles into the semiconductor substrate; subjecting the semiconductor substrate to a heat treatment after having formed the crystal defects; attaching a supporting plate on the front surface side of the semiconductor substrate after the heat treatment; thinning the semiconductor substrate by grinding a back surface side of the semiconductor substrate to which the supporting plate has been attached; and forming a back surface structure of the semiconductor element on a back surface of the thinned semiconductor substrate.

The above manufacturing method can perform the forming of a front surface structure, the implanting of charged particles, and the heat treatment on a thick semiconductor substrate that is yet to be thinned. The thick semiconductor substrate that is yet to be thinned hardly breaks and/or cracks during work. This makes it possible to inhibit the semiconductor substrate from being damaged in the forming of the front surface structure, in the forming of the crystal defects, and in the subjecting of the semiconductor substrate to the heat treatment. Further, since the supporting plate is attached on the front surface side of the semiconductor substrate prior to the thinning of the semiconductor substrate and the forming of the back surface structure, the thinning of the semiconductor substrate and the forming of the back surface structure can be carried out in a state where the semiconductor substrate is supported by the supporting plate. That is, the semiconductor substrate can also be inhibited from being damaged in the thinning of the semiconductor substrate and in the forming of the back surface structure. As a result, the yield of semiconductor devices can be increased.

DETAILED DESCRIPTION

Embodiments (Configuration of a Semiconductor Device 100)

Figure 1:
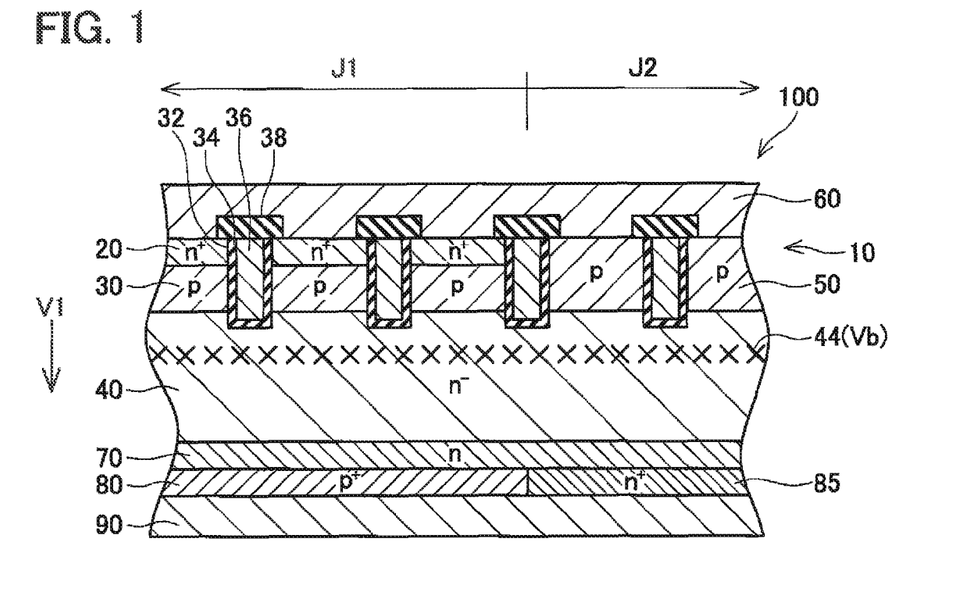
FIG. 1 is a cross-sectional view of a semiconductor device.

A method for manufacturing a semiconductor device of the present embodiment is a method for manufacturing a semiconductor device 100 shown in FIG. 1. The semiconductor device 100 of FIG. 1 is a reverse conducting IGBT in which an IGBT (Insulated Gate Bipolar Transistor) region J1 and a diode region J2 are formed on the same semiconductor substrate 10. In another embodiment, the semiconductor device 100 may be any other vertical semiconductor device. Insulating layers 38 and a front surface electrode 60 are formed on a front surface of the semiconductor substrate 10. The front-surface electrode 60 is formed on the entire front surface of the semiconductor substrate 10. A back surface electrode 90 is formed on a back surface of the semiconductor substrate 10. The back surface electrode 90 is formed on the entire back surface of the semiconductor substrate 10.

In the IGBT region J1, an n-type emitter region 20, a p-type body region 30, an n-type drift region 40, an n-type buffer region 70, and a p-type collector region 80 are formed. An upper surface of the emitter region 20 is connected to the front surface electrode 60 by an Ohmic contact. A lower surface of the collector region 80 is connected to the back surface electrode 90 by an Ohmic contact. In the IGBT region J1, a plurality of gate trenches 32 is further formed. A trench gate electrode 36 covered with a gate insulating film 34 is formed inside each of the gate trenches 32. An upper surface of each trench gate electrode 36 is covered with the insulating layer 38 to be insulated from the front surface electrode 60. The trench gate electrodes 36 are electrically connected to an outside at a position not shown in the figure.

In the diode region J2, a p-type anode region 50, the n-type drift region 40, the n-type buffer region 70, and an n-type cathode region 85 are formed. An upper surface of the anode region 50 is connected to the front surface electrode 60 by an Ohmic contact. A lower surface of the cathode region 85 is connected to the back surface electrode 90 by an Ohmic contact. The drift region 40 and the buffer region 70 in the diode region J2 are continuous with the drift region 40 and the buffer region 70 in the IGBT region J1. In the diode region J2 also, the plurality of trench gate electrodes 36 is formed, which is the same as those formed in the IGBT region J1.

In the semiconductor substrate 10, there is a crystal defect region 44 formed by implanting helium ions. The crystal defect region 44 is continuously formed across the IGBT region J1 and the diode region J2. The crystal defect region 44 shown in FIG. 1 is a region (i.e. a peak region of crystal defect density) of which crystal defect density is higher than that of any other part of the semiconductor substrate 10.

Figure 2:
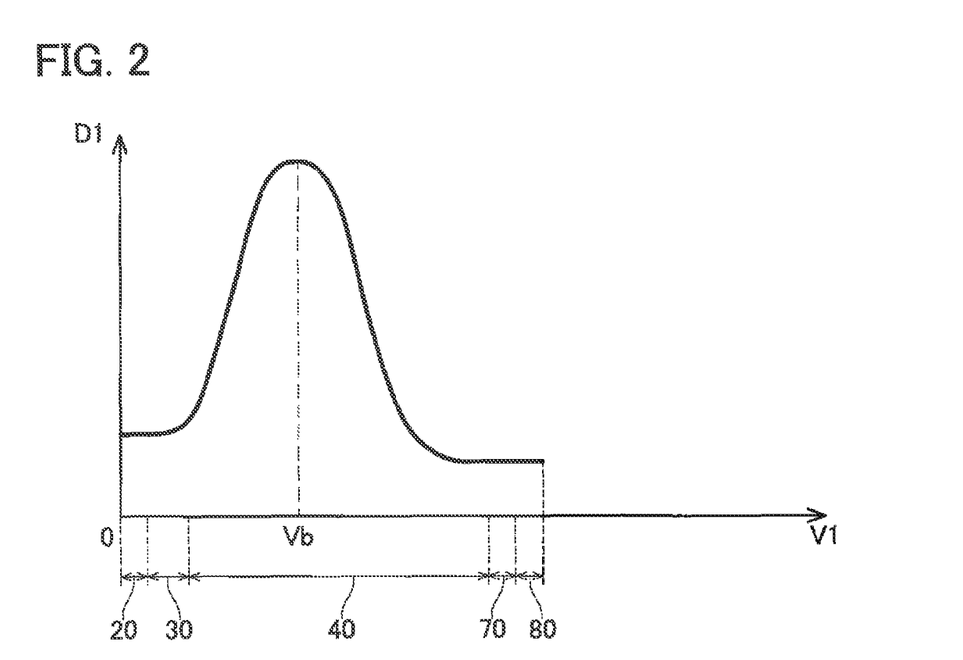
FIG. 2 is a graph showing a relationship between the depth and the crystal defect density in a semiconductor substrate of a semiconductor device.

FIG. 2 shows a distribution of the crystal defect density in a depth direction (i.e. in the direction of an arrow V1 of FIG. 1) from the front surface of the semiconductor substrate 10. The horizontal axis of the graph of FIG. 2 represents a depth from the front surface of the semiconductor substrate 10. The origin of the horizontal axis represents a position of the front surface of the semiconductor substrate 10. The right end of the horizontal axis represents a position of the back surface of the semiconductor substrate 10. Further, a depth Vb is a depth at which the crystal defect region 44 of FIG. 1 is formed. The vertical axis of the graph of FIG. 2 represents a density D1 of crystal defects.

As shown in FIG. 2, in the semiconductor device 100 of FIG. 1, crystal defects having a high density are locally formed centered at the depth Vb, and crystal defects having a predetermined density is formed in an entire area in the depth direction. The semiconductor device 100 of FIG. 1 has its turn-off characteristics properly adjusted by a combination of the crystal defects formed in the entire area in the depth direction and the crystal defects locally formed at high density.

(Manufacturing Method)

Figure 3:
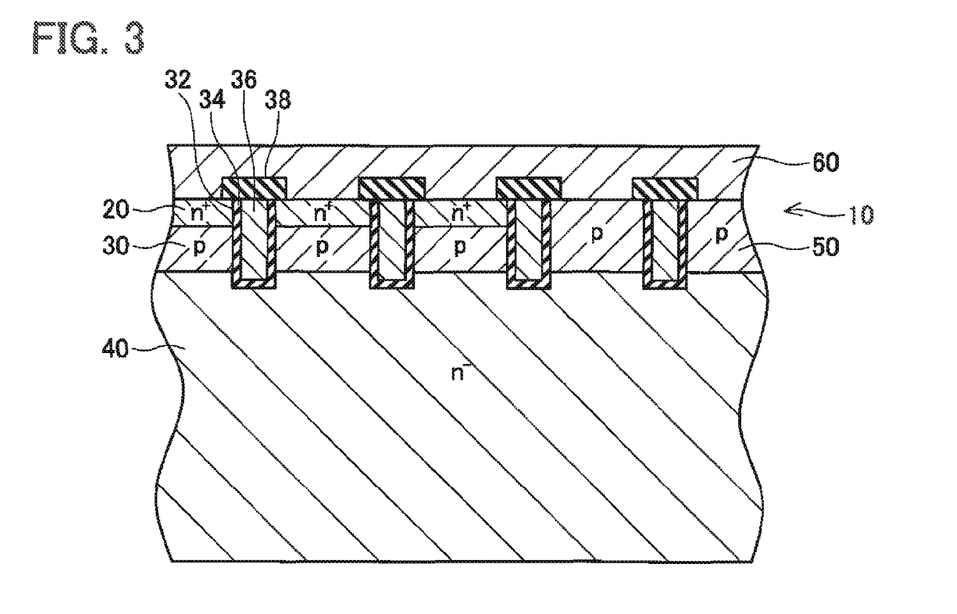
FIG. 3 is a cross-sectional view (1) showing a method for manufacturing a semiconductor device.

Next, a method for manufacturing a semiconductor device 100 of the present embodiment is described. First, as shown in FIG. 3, a front surface structure of the semiconductor device 100 is formed on a front surface of a semiconductor substrate 10 made of Si. That is, an emitter region 20, a body region 30, and an anode region 50 are formed on the front surface of the semiconductor substrate 10. Further, a plurality of gate trenches 32 is formed, and a trench gate electrode 36 covered with a gate insulating film 34 is formed inside each of the gate trenches 32. An insulating layer 38 is formed on an upper surface of each of the trench gate electrodes 36. A front surface electrode 60 is formed on the front surface of the semiconductor substrate 10 and front surfaces of the insulating layers 38. The front surface electrode 60 is connected to the emitter region 20 and the anode region 50 by Ohmic contacts. Each of the elements of the front surface structure of the semiconductor device 100 is formed by a well-known method. This causes a portion of the semiconductor substrate 10 that is deeper than the body region 30 and the anode region 50 to form a drift region 40 of the semiconductor device 100. At this occasion, the thickness of the semiconductor substrate 10 including the front surface structure (i.e. the thickness of the semiconductor substrate 10 in the V1 direction in FIG. 1) is thicker than the thickness (e.g. approximately 100 μm) of the semiconductor device 100 as a product (see FIG. 1). The thickness of the semiconductor substrate 10 at this timing is, for example, 500 μm or greater and less than 900 μm.

Figure 4:
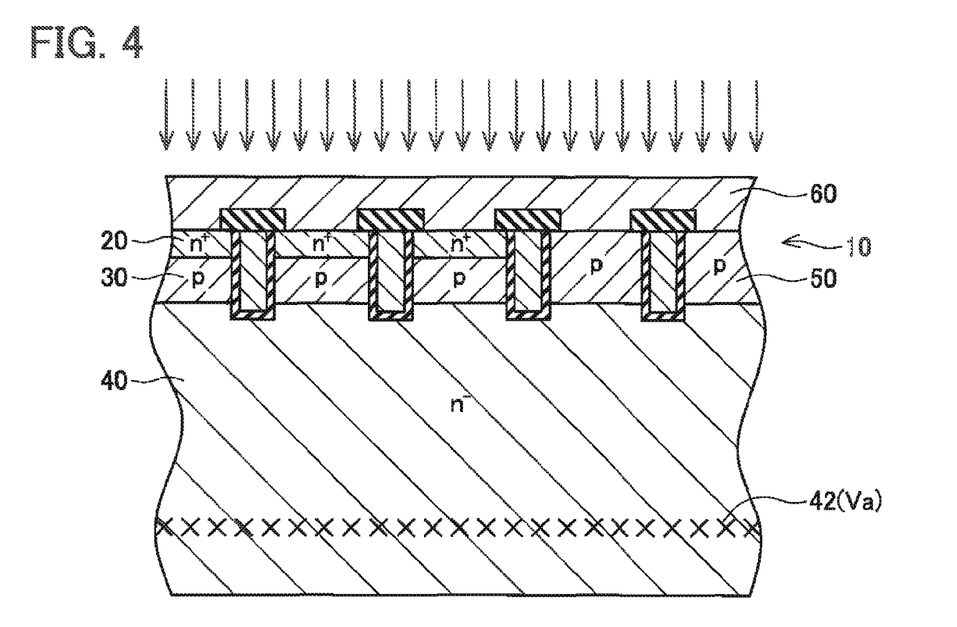
FIG. 4 is a cross-sectional view (2) showing the method for manufacturing a semiconductor device.
Figure 5:
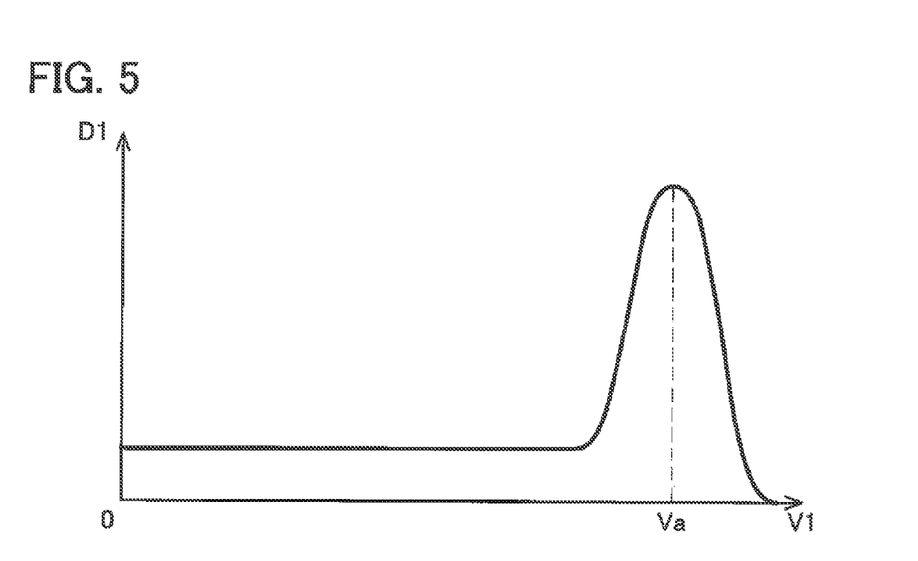
FIG. 5 is a graph (1) showing a relationship between the depth and the crystal defect density in a semiconductor substrate of FIG. 4.

Next, as shown in FIG. 4, helium ions are implanted into the semiconductor substrate 10 from a front surface side of the semiconductor substrate 10. The implanting of the helium ions is carried out by an injection apparatus (not illustrated). The injection apparatus is arranged on the front surface side of the semiconductor substrate 10. The injection apparatus injects the helium ions at energy of such magnitude (i.e., at such a moving speed) that a peak of crystal defect density is formed at a depth Va in the semiconductor substrate 10. It should be noted that the depth Va is deeper than the aforementioned depth Vb. The ejected helium ions penetrate through the front surface electrode 60 to be implanted into the semiconductor substrate 10 from the front surface side of the semiconductor substrate 10. The implanted helium ions do not penetrate through the whole semiconductor substrate 10 but is remained in the vicinity of the depth Va. This causes the peak of the crystal defect density to be formed at the depth Va. As a result, a crystal defect region 42 having a high crystal defect density is formed at the depth Va. Further, crystal defects (not illustrated) having a predetermined density are formed in an entire area of the semiconductor substrate 10 from the front surface to the depth Va. At a timing when the step of FIG. 4 is finished, the crystal defect density in the depth direction from the front surface of the semiconductor substrate 10 is distributed as shown by the graph of FIG. 5. In other words, the peak of the crystal defect density is formed at the depth Va while the crystal defects having a predetermined density are also formed in the entire area of the semiconductor substrate 10 from the front surface to the depth Va.

Figure 6:
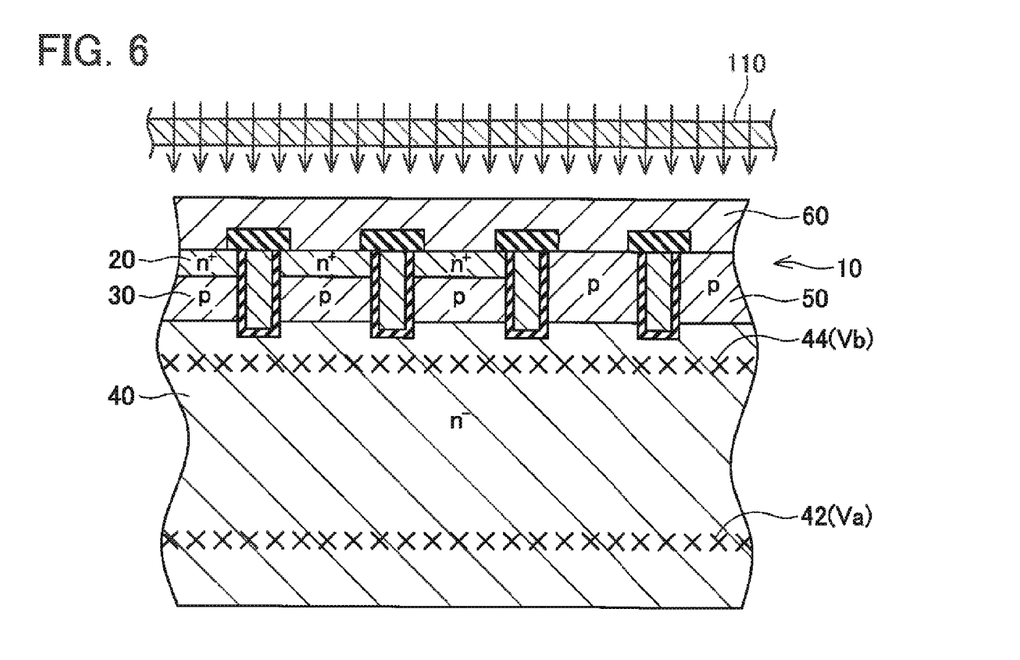
FIG. 6 is a cross-sectional view (3) showing the method for manufacturing a semiconductor device.
Figure 7:
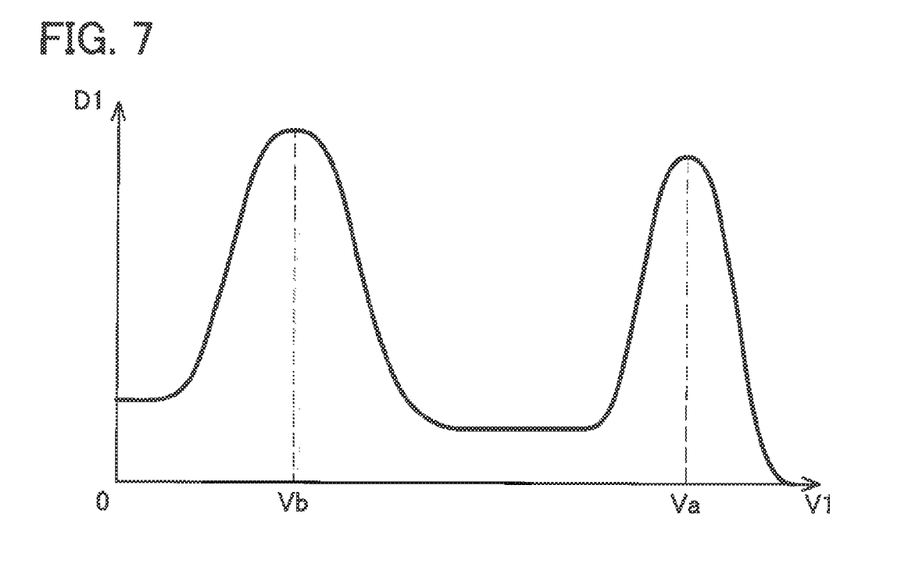
FIG. 7 is a graph (2) showing a relationship between the depth and the crystal defect density in a semiconductor substrate of FIG. 6.

Next, as shown in FIG. 6, the helium ions are further implanted into the semiconductor substrate 10 from the front surface side of the semiconductor substrate 10. During this implanting, the positional relationship between the semiconductor substrate 10 and the injection apparatus is not changed from the previous implanting (see FIG. 4). However, aluminum foil 110 is disposed between the front surface of the semiconductor substrate 10 and the injection apparatus. In the case of FIG. 6 too, the injection apparatus ejects the helium ions at energy of the same magnitude as that in the case of FIG. 4. The ejected helium ions penetrate through the aluminum foil 110 and the front surface electrode 60 to be implanted into the semiconductor substrate 10. The energy of the helium ions is attenuated due to having passed through the aluminum foil 110. Due to this, the energy of the helium ions implanted into the semiconductor substrate 10 in FIG. 6 is lower than that in the case of FIG. 4. As a result, the helium ions implanted into the semiconductor substrate 10 is remained in the vicinity of the depth Vb, which is shallower than the depth Va. This causes a peak of the crystal defect density to be formed at the depth Vb. As a result, a crystal defect region 44 having a high crystal defect density is formed at the depth Vb. Therefore, at a timing when the step of FIG. 6 is finished, the crystal defect density in the depth direction from the front surface of the semiconductor substrate 10 is distributed as shown by the graph of FIG. 7. That is, the peaks of the crystal defect density are formed at the depths Va and Vb, respectively. Furthermore, crystal defects having a predetermined density are formed in the entire area of the semiconductor substrate 10 from the front surface to the depth Va.

Next, the crystal defects are recovered by subjecting a heat treatment to the semiconductor substrate 10 into which the helium ions have been implanted. The heat treatment is carried out by furnace annealing at a temperature of 300° C. or higher to lower than 500° C., for example.

Next, the semiconductor substrate 10 is reduced in diameter by grinding peripheral portions of the semiconductor substrate 10 which had been subjected to the heat treatment. In this example, the diameter of the semiconductor substrate 10 is reduced from 200 mm to 198 mm.

Figure 8:
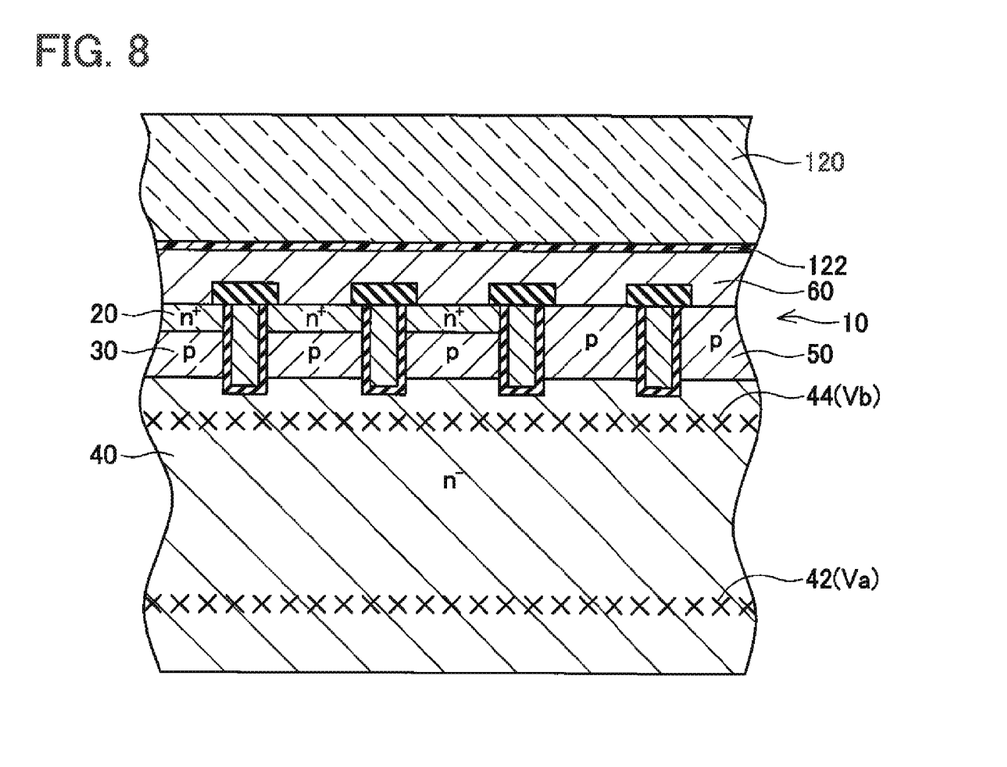
FIG. 8 is a cross-sectional view (4) showing the method for manufacturing a semiconductor device.

Next, as shown in FIG. 8, a supporting plate 120 made of glass is attached on a front surface of the front surface electrode 60. The supporting plate 120 is attached by an adhesive material 122 made of resin. A thickness of the supporting plate 120 is for example approximately 500 μm.

Figure 9:
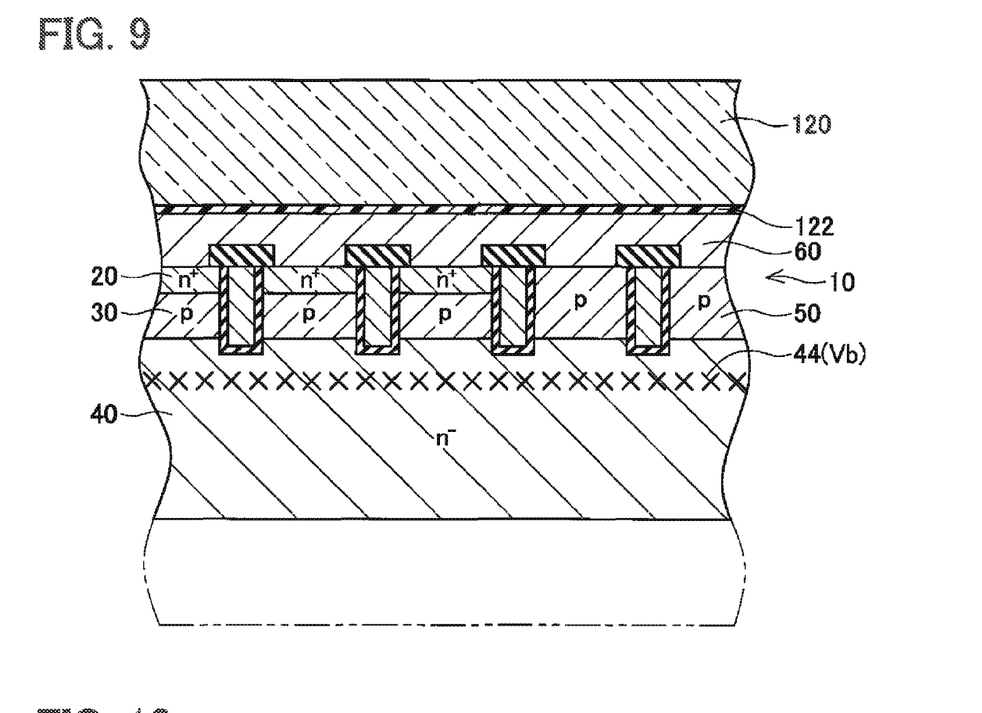
FIG. 9 is a cross-sectional view (5) showing the method for manufacturing a semiconductor device.

Next, as shown in FIG. 9, the semiconductor substrate 10 is thinned by grinding the back surface of the semiconductor substrate 10. For example, the back surface of the semiconductor substrate 10 is ground until the thickness of the semiconductor substrate 10 becomes approximately 100 μm. At this occasion, a part of the semiconductor substrate 10 including the depth Va is removed by the grinding. That is, the crystal defect region 42 (see FIG. 7) is removed by the grinding. After the grinding, the back surface of the semiconductor substrate 10 is wet-etched so that the back surface thus ground is planarized.

At a timing when the thinning is finished, the crystal defect density in the depth direction from the front surface of the semiconductor substrate 10 is distributed as shown by the graph of FIG. 2. That is, a peak of the crystal defect density is formed at the depth Vb, and crystal defects having a predetermined density are formed in the entire area in the depth direction of the semiconductor substrate 10. Since the part including the depth Va has been removed by the thinning of the semiconductor substrate 10, the peak of the crystal defect density that was formed at the depth Va no longer exists.

Figure 10:
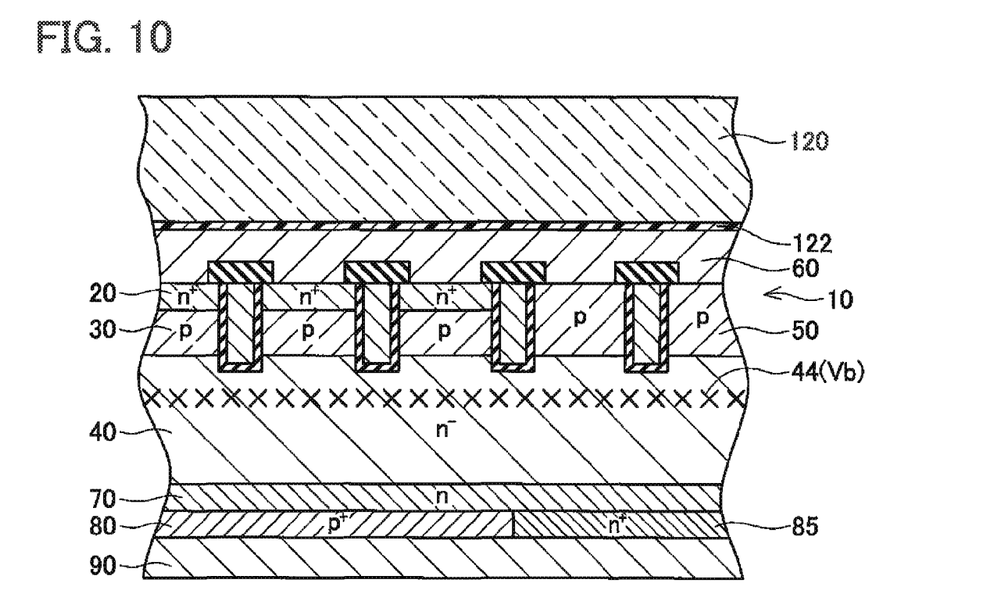
FIG. 10 is a cross-sectional view (6) showing the method for manufacturing a semiconductor device.

Next, as shown in FIG. 10, a back surface structure of the semiconductor device 100 is formed on the back surface of the semiconductor substrate 10. That is, first, a buffer region 70, a collector region 80, and a cathode region 85 are formed on the back surface of the semiconductor substrate 10. These regions 70, 80, and 85 are formed by carrying out laser annealing after impurity injection. Next, a back surface electrode 90 is formed on the entire back surface of the semiconductor substrate 10. The back surface electrode 90 can be formed, for example, by sputtering.

Thereafter, the supporting plate 120 is removed from the front surface of the front surface electrode 60. The semiconductor device 100 of FIG. 1 is completed by executing the steps described above.

The manufacturing method of the present embodiment makes it possible to form a front surface structure, to inject helium ions, and to conduct a heat treatment, on a thick semiconductor substrate 10 that is yet to be thinned. The thick semiconductor substrate 10 that is yet to be thinned hardly breaks or cracks during work. Therefore, the semiconductor substrate 10 can be inhibited from being damaged in the forming of the front surface structure, in the forming of the crystal defects, and in the subjecting of the semiconductor substrate 10 to the heat treatment. Further, since the supporting plate 120 is attached on the front surface of the front surface electrode 60 prior to the thinning of the semiconductor substrate 10 and the forming of the back surface structure, the thinning of the semiconductor substrate 10 and the forming of the back surface structure can be carried out in a state where the semiconductor substrate 10 is supported by the supporting plate 120. That is, the semiconductor substrate 10 can also be inhibited from being damaged in the thinning of the semiconductor substrate 10 and in the forming of the back surface structure. As a result, the yield of semiconductor devices 100 can be increased.

For a high-speed switching of the semiconductor device 100, it is desirable that a certain amount of crystal defects be formed within the semiconductor substrate 10. Although it is preferable that the crystal defects be formed at a depth in the vicinity of a p-n junction, an excessive increase in the crystal defect amount in this portion may cause leak current to be generated. Therefore, in order to inhibit the generation of leak current and also to achieve the high-speed switching of the semiconductor device 100, it is preferable to form a semiconductor device in which the crystal defects are formed in an entire area in a depth direction of the semiconductor substrate 10 and a peak of crystal defect density is formed at the depth in the vicinity of a p-n junction.

In this regard, the manufacturing method of the present embodiment makes it possible, with the first implanting of helium ions (see FIG. 4), to form a peak of crystal defect density at the depth Va within the semiconductor substrate 10 and to form crystal defects having a predetermined density in the entire area of the semiconductor substrate 10 from the front surface to the depth Va (see FIG. 5). Furthermore, the manufacturing method of the present embodiment makes it possible, with the second implanting of helium ions (see FIG. 6), to form a peak of crystal defect density at the depth Vb within the semiconductor substrate 10 and to form crystal defects having the predetermined density in the entire area of the semiconductor substrate 10 from the front surface to the depth Vb (see FIG. 7). Further, the removing of the part of the semiconductor substrate 10 including the depth Va by grinding in the thinning of the semiconductor substrate 10 (see FIG. 9) makes it possible to obtain the semiconductor substrate 10 with crystal defects formed in an entire area in its depth direction and with a peak of crystal defect density formed at the depth Vb. A combination of the crystal defects formed in the entire area in the depth direction and the crystal defects having a high density locally formed makes it possible to manufacture a semiconductor device 100 of which turn-off characteristics has been properly adjusted (i.e. that achieves the high-speed switching of the semiconductor device 100 and also the inhibition of the generation of leak current).

Further, in the manufacturing method of the present embodiment, the helium ions implanted into the semiconductor substrate 10 do not penetrate the semiconductor substrate 10. In this regard, it is also possible to form crystal defects having a predetermined density in the entire area of the semiconductor substrate 10 by, instead of implanting the helium ions at the depth Va, implanting the helium ions so that the helium ions penetrate the semiconductor substrate 10. However, in the case of implanting the helium ions so that the helium ions penetrate the semiconductor substrate 10, the helium ions having penetrated the semiconductor substrate 10 may cause damage to equipment for implantation, such as a mounting table (not illustrated) on which the semiconductor substrate 10 is mounted. Contrary to this, the manufacturing method of the present embodiment does not allow the helium ions implanted into the semiconductor substrate 10 to penetrate the semiconductor substrate 10, and can therefore prevent the helium ions from damaging the equipment for implantation.

The method for manufacturing the semiconductor device 100 of the present embodiment has been described above. The helium ions in the present embodiment are an example of the "charged particles". The depth Va is an example of the "first depth". The depth Vb is an example of the "second depth".

While specific examples of the present invention have been described above in detail, these examples are merely illustrative and place no limitation on the scope of the patent claims. The technology described in the patent claims also encompasses various changes and modifications to the specific examples described above. For example, the following modifications may be adopted.

(Modification 1) In the embodiment, the helium ions are implanted to form the crystal defects in the semiconductor substrate 10 (see FIGS. 4 and 6). The charged particles that are implanted into the semiconductor substrate 10 are not limited to the helium ions. For example, proton, deutron (deuterium ions), or the like may be implanted.

(Modification 2) In the embodiment, the helium ions are implanted into the semiconductor substrate 10 separately in twice (see FIGS. 4 and 6). This does not imply any limitation. The helium ions may be implanted all at once. Generally speaking, crystal defects need only to be formed in a semiconductor substrate by implanting charged particles into the semiconductor substrate.

(Modification 3) In the embodiment, the injection apparatus is disposed on the front surface side of the semiconductor substrate 10, and the helium ions are implanted from the front surface side of the semiconductor substrate 10 (see FIGS. 4 and 6). This does not imply any limitation. The injection apparatus may be disposed on the back surface side of the semiconductor substrate 10, and the helium ions may be implanted from the back surface side of the semiconductor substrate 10. Generally speaking, crystal defects need only to be formed in a semiconductor substrate by implanting charged particles into the semiconductor substrate.

(Modification 4) In the embodiment, when implanting the helium ions at the depth Vb within the semiconductor substrate 10, the aluminum foil 110 is disposed between the semiconductor substrate 10 and the injection apparatus and the helium ions are ejected at the same energy as that at which the helium ions are implanted at the depth Va within the semiconductor substrate 10 (see FIG. 6). This does not imply any limitation. When implanting the helium ions at the depth Vb within the semiconductor substrate 10, the injection energy at which the helium ions are ejected from the injection apparatus may be set lower than that of when implanting helium ions at the depth Va within the semiconductor substrate 10. In this case, a member such as the aluminum foil does not need to be disposed between the semiconductor substrate 10 and the injection apparatus. Generally speaking, the implanting of the charged particles at the first depth and the implanting of the charged particles at the second depth that is shallower than the first depth, are sufficient.

The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

Some of the features of the disclosures herein will be described. The forming of the crystal defects may comprise: implanting the charged particles so that a first peak of crystal defect density is formed at a first depth from the front surface side of the semiconductor substrate; and implanting the charged particles so that a second peak of the crystal defect density is formed at a second depth from the front surface side of the semiconductor substrate, wherein the second depth is shallower than the first depth. The thinning of the semiconductor substrate may comprise removing a part of the semiconductor substrate including a first depth region by grinding.

For a high-speed switching of the semiconductor device, it is desirable that a certain amount of crystal defects be formed within the semiconductor substrate. Although it is preferable that the crystal defects be formed at a depth in the vicinity of a p-n junction, an excessive increase in the crystal defect amount in this portion may cause leak current to be generated. Therefore, in order to inhibit the generation of leak current and also to achieve the high-speed switching of the semiconductor device, it is preferable to form a semiconductor device in which the crystal defects are formed in an entire area of the semiconductor substrate in its depth direction and a peak of crystal defect density is formed at the depth in the vicinity of a p-n junction.

In this regard, the above method can, by performing the implanting of the charged particles at the first depth, form the first peak of the crystal defect density at the first depth within the semiconductor substrate and form the crystal defects having a predetermined density in the entire area of the semiconductor substrate from the front surface to the first depth. Further, the method can, by performing the implanting of the charged particles at the second depth, form the second peak of the crystal defect density at the second depth within the semiconductor substrate and form the crystal defects having a predetermined density at a predetermined density in the entire area of the semiconductor substrate from the front surface to the second depth. It should be noted here that either the crystal defect density at the first peak or the crystal defect density at the second peak may be higher than the other. Further, the removing of the part of the semiconductor substrate including the first depth region by grinding in the course of thinning of the semiconductor substrate, makes it possible to obtain a semiconductor substrate having crystal defects formed in a entire area of its depth direction and having a peak of the crystal defect density at the second depth. A combination of the crystal defects formed in the entire area of its depth direction and the crystal defects locally formed at high density makes it possible to manufacture a semiconductor device of which turn-off characteristics are properly adjusted. Further, this method does not allow the charged particles that are implanted to pass through the semiconductor substrate, and can therefore also prevent the charged particles from damaging equipment for implantation.

What is claimed is:

1. A method for manufacturing a semiconductor device, the method comprising:

forming a front surface structure of a semiconductor element on a front surface side of a semiconductor substrate;

forming crystal defects in the semiconductor substrate by implanting charged particles into the semiconductor substrate;

subjecting the semiconductor substrate to a heat treatment after having formed the crystal defects;

attaching a supporting plate on the front surface side of the semiconductor substrate after the heat treatment;

thinning the semiconductor substrate by grinding a back surface side of the semiconductor substrate to which the supporting plate has been attached;

forming a back surface electrode on a back surface of the thinned semiconductor substrate; and removing the supporting plate from the front surface side of the semiconductor substrate after forming the back surface structure.

2. The method as in claim 1, wherein the forming of the crystal defects comprises:

implanting the charged particles so that a first peak of crystal defect density is formed at a first depth from the front surface side of the semiconductor substrate; and implanting the charged particles so that a second peak of the crystal defect density is formed at a second depth from the front surface side of the semiconductor substrate, wherein the second depth is shallower than the first depth, the thinning of the semiconductor substrate comprises removing a part of the semiconductor substrate including a first depth region by grinding.

3. The method as in claim 1, wherein the charged particles include at least one of helium ions, protons, and deuterons.

* * * * *